United States Patent
Zhao et al.

(10) Patent No.: US 9,263,136 B1
(45) Date of Patent: Feb. 16, 2016

(54) DATA RETENTION FLAGS IN SOLID-STATE DRIVES

(71) Applicant: Western Digital Technologies, Inc., Irvine, CA (US)

(72) Inventors: Dengtao Zhao, Santa Clara, CA (US); Yongke Sun, Pleasanton, CA (US); Haibo Li, Sunnyvale, CA (US); Jui-Yao Yang, San Jose, CA (US); Kroum Stoev, Pleasanton, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 9 days.

(21) Appl. No.: 14/090,426

(22) Filed: Nov. 26, 2013

Related U.S. Application Data

(60) Provisional application No. 61/873,503, filed on Sep. 4, 2013.

(51) Int. Cl.
| | | |
|---|---|---|
| *G11C 7/22* | (2006.01) | |
| *G11C 16/10* | (2006.01) | |
| *G11C 16/04* | (2006.01) | |
| *G11C 11/406* | (2006.01) | |
| *G11C 29/44* | (2006.01) | |

(52) U.S. Cl.
CPC .............. *G11C 16/10* (2013.01); *G11C 11/406* (2013.01); *G11C 16/0483* (2013.01); *G11C 29/4401* (2013.01)

(58) Field of Classification Search
CPC .................. G11C 29/4401; G11C 29/4402
USPC ........... 365/185.09, 185.18, 200, 201, 210.12
See application file for complete search history.

(56) References Cited

U.S. PATENT DOCUMENTS

| | | |
|---|---|---|
| 6,856,556 B1 | 2/2005 | Hajeck |
| 7,126,857 B2 | 10/2006 | Hajeck |
| 7,430,136 B2 | 9/2008 | Merry, Jr. et al. |
| 7,447,807 B1 | 11/2008 | Merry et al. |
| 7,502,256 B2 | 3/2009 | Merry, Jr. et al. |
| 7,509,441 B1 | 3/2009 | Merry et al. |
| 7,596,643 B2 | 9/2009 | Merry, Jr. et al. |
| 7,653,778 B2 | 1/2010 | Merry, Jr. et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,765,373 B1 | 7/2010 | Merry et al. |
| 7,898,855 B2 | 3/2011 | Merry, Jr. et al. |
| 7,912,991 B1 | 3/2011 | Merry et al. |

(Continued)

*Primary Examiner* — Hoai V Ho
*Assistant Examiner* — Jay Radke
(74) *Attorney, Agent, or Firm* — McDermott Will & Emery LLP

(57) ABSTRACT

Systems and methods for managing data retention in a solid-state storage system utilizing data retention flag bytes are disclosed. A data storage device includes a non-volatile memory comprising a plurality of non-volatile memory devices and a controller configured to write data to a memory unit of the non-volatile memory array and write a data retention flag value indicating a number of bits of the written data programmed in a first of a plurality of logical states. The controller is further configured to read the data and determine a number of bits having the first of the plurality of logical states in the read data, and determine a difference between the number of bits of the written data programmed in the first logical state and the number of bits having the first logical state in the read data. The difference is used to determine data retention characteristics of the non-volatile memory.

29 Claims, 9 Drawing Sheets

(56) References Cited

U.S. PATENT DOCUMENTS

| | | | |
|---|---|---|---|
| 7,936,603 | B2 | 5/2011 | Merry, Jr. et al. |
| 7,962,792 | B2 | 6/2011 | Diggs et al. |
| 8,078,918 | B2 | 12/2011 | Diggs et al. |
| 8,090,899 | B1 | 1/2012 | Syu |
| 8,095,851 | B2 | 1/2012 | Diggs et al. |
| 8,108,692 | B1 | 1/2012 | Merry et al. |
| 8,122,185 | B2 | 2/2012 | Merry, Jr. et al. |
| 8,127,048 | B1 | 2/2012 | Merry et al. |
| 8,135,903 | B1 | 3/2012 | Kan |
| 8,151,020 | B2 | 4/2012 | Merry, Jr. et al. |
| 8,161,227 | B1 | 4/2012 | Diggs et al. |
| 8,166,245 | B2 | 4/2012 | Diggs et al. |
| 8,243,525 | B1 | 8/2012 | Kan |
| 8,254,172 | B1 | 8/2012 | Kan |
| 8,261,012 | B2 | 9/2012 | Kan |
| 8,296,625 | B2 | 10/2012 | Diggs et al. |
| 8,312,207 | B2 | 11/2012 | Merry, Jr. et al. |
| 8,316,176 | B1 | 11/2012 | Phan et al. |
| 8,341,339 | B1 | 12/2012 | Boyle et al. |
| 8,375,151 | B1 | 2/2013 | Kan |
| 8,392,635 | B2 | 3/2013 | Booth et al. |
| 8,397,107 | B1 | 3/2013 | Syu et al. |
| 8,407,449 | B1 | 3/2013 | Colon et al. |
| 8,423,722 | B1 | 4/2013 | Deforest et al. |
| 8,433,858 | B1 | 4/2013 | Diggs et al. |
| 8,443,167 | B1 | 5/2013 | Fallone et al. |
| 8,447,920 | B1 | 5/2013 | Syu |
| 8,458,435 | B1 | 6/2013 | Rainey, III et al. |
| 8,478,930 | B1 | 7/2013 | Syu |
| 8,489,854 | B1 | 7/2013 | Colon et al. |
| 8,503,237 | B1 | 8/2013 | Horn |
| 8,521,972 | B1 | 8/2013 | Boyle et al. |
| 8,549,236 | B2 | 10/2013 | Diggs et al. |
| 8,583,835 | B1 | 11/2013 | Kan |
| 8,601,311 | B2 | 12/2013 | Horn |
| 8,601,313 | B1 | 12/2013 | Horn |
| 8,612,669 | B1 | 12/2013 | Syu et al. |
| 8,612,804 | B1 | 12/2013 | Kang et al. |
| 8,615,681 | B2 | 12/2013 | Horn |
| 8,638,602 | B1 | 1/2014 | Horn |
| 8,639,872 | B1 | 1/2014 | Boyle et al. |
| 8,683,113 | B2 | 3/2014 | Abasto et al. |
| 8,700,834 | B2 | 4/2014 | Horn et al. |
| 8,700,950 | B1 | 4/2014 | Syu |
| 8,700,951 | B1 | 4/2014 | Call et al. |
| 8,706,985 | B1 | 4/2014 | Boyle et al. |
| 8,707,104 | B1 | 4/2014 | Jean |
| 8,713,066 | B1 | 4/2014 | Lo et al. |
| 8,713,330 | B1 * | 4/2014 | Sommer et al. ............... 713/193 |
| 8,713,357 | B1 | 4/2014 | Jean et al. |
| 8,719,531 | B2 | 5/2014 | Strange et al. |
| 8,724,422 | B1 | 5/2014 | Agness et al. |
| 8,725,931 | B1 | 5/2014 | Kang |
| 8,745,277 | B2 | 6/2014 | Kan |
| 8,751,728 | B1 | 6/2014 | Syu et al. |
| 8,769,190 | B1 | 7/2014 | Syu et al. |
| 8,769,232 | B2 | 7/2014 | Suryabudi et al. |
| 8,775,720 | B1 | 7/2014 | Meyer et al. |
| 8,782,327 | B1 | 7/2014 | Kang et al. |
| 8,788,778 | B1 | 7/2014 | Boyle |
| 8,788,779 | B1 | 7/2014 | Horn |
| 8,788,880 | B1 | 7/2014 | Gosla et al. |
| 8,793,429 | B1 | 7/2014 | Call et al. |
| 2005/0281112 | A1 * | 12/2005 | Ito ........................ G11C 11/406 365/222 |
| 2008/0209150 | A1 * | 8/2008 | Byeon .......................... 711/166 |
| 2010/0174849 | A1 | 7/2010 | Walston et al. |
| 2010/0250793 | A1 | 9/2010 | Syu |
| 2011/0044101 | A1 * | 2/2011 | Chou et al. ............... 365/185.03 |
| 2011/0099323 | A1 | 4/2011 | Syu |
| 2011/0283049 | A1 | 11/2011 | Kang et al. |
| 2012/0260020 | A1 | 10/2012 | Suryabudi et al. |
| 2012/0278531 | A1 | 11/2012 | Horn |
| 2012/0284460 | A1 | 11/2012 | Guda |
| 2012/0324191 | A1 | 12/2012 | Strange et al. |
| 2013/0016562 | A1 * | 1/2013 | Mun ........................ 365/185.12 |
| 2013/0132638 | A1 | 5/2013 | Horn et al. |
| 2013/0145106 | A1 | 6/2013 | Kan |
| 2013/0185606 | A1 * | 7/2013 | Fai ..................... G06F 11/1068 714/704 |
| 2013/0290793 | A1 | 10/2013 | Booth et al. |
| 2014/0059405 | A1 | 2/2014 | Syu et al. |
| 2014/0101369 | A1 | 4/2014 | Tomlin et al. |
| 2014/0115427 | A1 | 4/2014 | Lu |
| 2014/0133220 | A1 | 5/2014 | Danilak et al. |
| 2014/0136753 | A1 | 5/2014 | Tomlin et al. |
| 2014/0149826 | A1 | 5/2014 | Lu et al. |
| 2014/0157078 | A1 | 6/2014 | Danilak et al. |
| 2014/0181432 | A1 | 6/2014 | Horn |
| 2014/0223255 | A1 | 8/2014 | Lu et al. |

* cited by examiner

DATA RETENTION FLAGS IN SOLID-STATE DRIVES

CROSS-REFERENCE TO RELATED APPLICATION

This application claims the benefit of U.S. Provisional Application No. 61/873,503, filed on Sep. 4, 2013, which is hereby incorporated by reference in its entirety.

BACKGROUND

1. Field

This disclosure relates to data storage systems. More particularly, the disclosure relates to systems and methods for monitoring data retention in solid-state drives.

2. Description of Related Art

Certain solid-state memory devices, such as flash drives, store information in an array of memory cells constructed with floating gate transistors. In single-level cell (SLC) flash devices, each cell stores a single bit of information. In multi-level cell (MLC) devices, each cell stores two or more bits of information. When a read operation is performed, the electrical charge levels of the cells are compared to one or more voltage reference values (also called "voltage read level" or "voltage threshold") to determine the state of individual cells. In SLC devices, a cell can be read using a single voltage reference value. In MLC devices, a cell is read using multiple voltage references values. Certain solid-state devices allow for a memory controller to set voltage read levels.

Various factors can contribute to data read errors in solid-state memory devices. These factors include charge loss or leakage over time, and device wear caused by usage. When the number of bit errors on a read operation exceeds the ECC (error correction code) correction capability of the storage subsystem, the read operation fails. Voltage read levels can contribute to a device's ability to decode data.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

DETAILED DESCRIPTION

Figure 1:
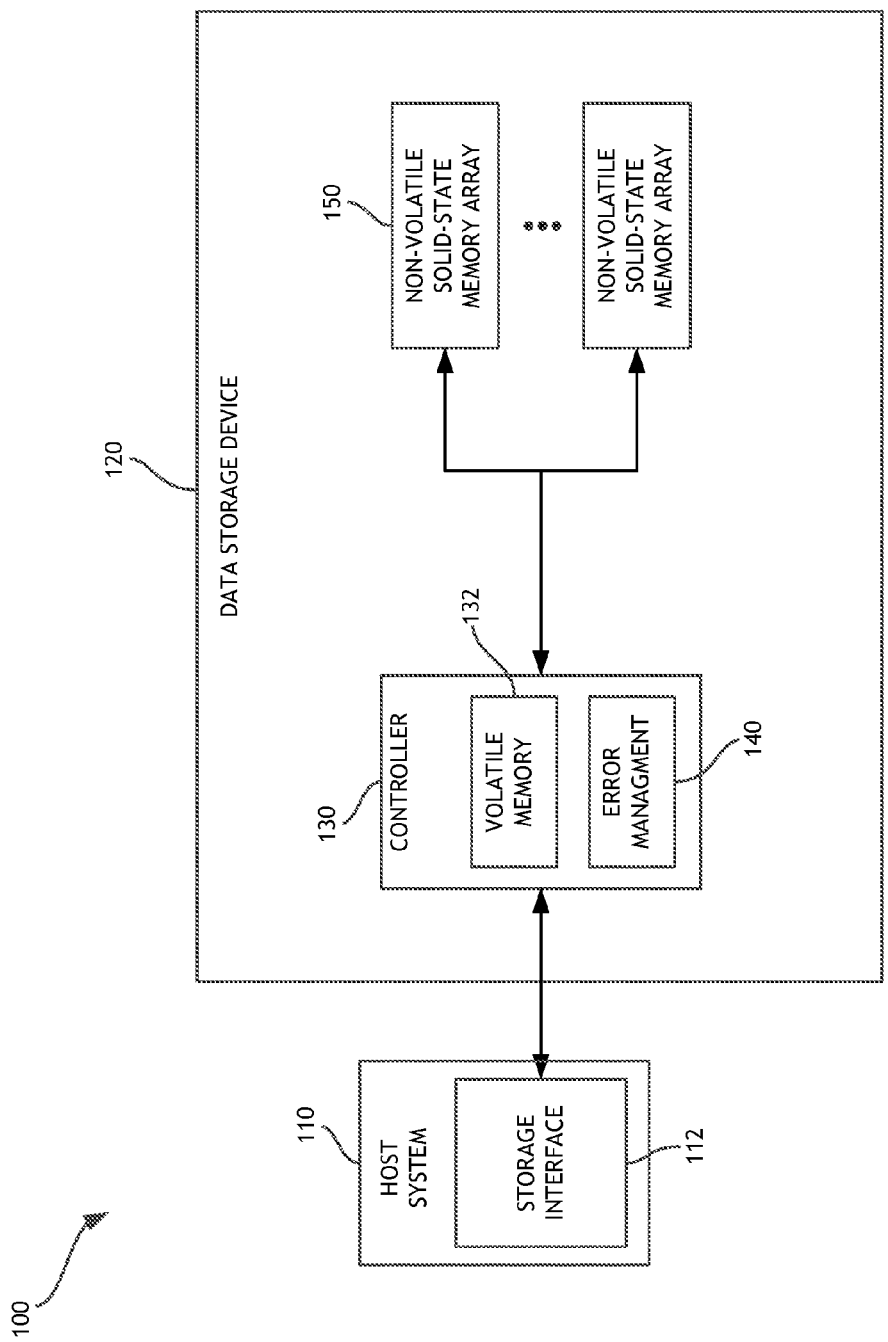
FIG. 1 is a block diagram illustrating a combination of a host system with storage device including an error management module.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

Overview

In certain solid-state media, such as NAND Flash, "data retention" refers to a memory failure factor relating to how long memory cells maintain a correct programmed state when the memory array is not under power bias. Data retention can be dependent on external environmental factors, such as, for example, high temperature and number of program/erase (P/E) cycles, which tend to degrade data retention in certain embodiments. Therefore, precise information relating to the data retention of solid-state memory can be useful in managing drive performance. However, obtaining such information can present significant challenges in solid-state memory systems.

In certain embodiments, a real timestamp is utilized to monitor data age in a solid-state data storage device, wherein the timestamp is stored in solid-state memory and provides a record of the time when data is programmed to the solid-state memory. The timestamp may accurately account for the time that elapses after programming for data retention purposes. However, using a time stamp alone, the system temperature, which can be particularly significant with respect to heavily-cycled blocks and can vary over time, may not be systematically accounted for. According to Arrhenius' equation, data retention may accelerate exponentially with elevated temperature, and therefore temperature effect can be significant. It may therefore be desirable to account for temperature effect in data retention management systems.

Certain embodiments disclosed herein provide systems and methods wherein additional metadata is programmed together with the raw data on the target page. The metadata may contain information relating to the raw data of the page, such as '1' or '0' bit count information. Upon execution of a read request, the data storage device may compare the count of '0' or '1' bits obtained from the read of the raw data against the count metadata stored. The difference between the count(s) for the raw data and the count(s) stored in metadata can provide a measure of data retention effect, wherein such measure may substantially account for both time and temperature. In certain embodiments, an optimal, or adjusted, reading voltage can be determined based on such data retention information when using a calibrated memory. The differential bit count information may also be adopted as an indicator for when certain data refreshing operations, such as data scrubbing, garbage collection, and/or the like, should be performed. For example, such information may be determined from raw bit error rate (RBER), which may be indicated by the difference information. In certain embodiments, data retention management functionality described herein may be performed independently of participation of the system error correction functionality (e.g., ECC engine).

Terminology

As used in this application, "non-volatile solid-state memory," "non-volatile memory," "NVM," or variations thereof may refer to solid-state memory such as NAND flash. However, the systems and methods of this disclosure may also be useful in more conventional hard drives and hybrid drives including both solid-state and hard drive components. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), MRAM, or other discrete NVM (non-volatile solid-state memory) chips. The non-volatile solid-state memory arrays or storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

The terms "page," "target page," or variations thereof are used herein according to their broad and ordinary meaning. For example, "page" may refer to a block of a physical memory cells, or to the physical memory cells themselves. Furthermore, within a multi-level cell (MLC), "page" may refer to either of upper or lower pages.

The terms "equivalent," as used to describe equivalent data retention time, may refer to an effective data retention state of a cell, block, die, or other portion of solid-state memory. Therefore, equivalent data retention time may take into consideration both the temperature experienced by the memory, as well as the time the data has been written to memory.

Data Storage System

FIG. 1 is a block diagram illustrating an embodiment of a combination of a host system 110 with a data storage device 120 incorporating error management functionality in accordance with embodiments disclosed herein. As shown, the data storage device 120 (e.g., hybrid hard drive, solid-state drive, any storage device utilizing solid-state memory, etc.) includes a controller 130, which in turn includes an error management module 140. In certain embodiments, the error management module 140 is configured to utilize one or more data retention flag bytes stored in blocks, or pages, of the non-volatile solid-state memory 150 to estimate effective data retention time and/or to calculate voltage read levels. The controller 130 can further include internal memory 132 for caching system mapping data, which may be of one or more suitable memory types, such as, for example, DRAM. In some embodiments, the controller 130 is configured to perform the data retention management functions as further described below.

The controller 130 may be configured to receive memory access commands from a storage interface (e.g., a device driver) 112 residing on a host system 110. The controller 130 may further execute commands in response to such host-issued memory commands in the non-volatile solid-state memory arrays 150. Storage access commands communicated by the storage interface 112 can include write and read commands issued by the host system 110. The commands can specify a block address in the data storage device 120, and the controller 130 can execute the received commands in the non-volatile solid-state memory array(s) 150. Data may be accessed/transferred based on such commands.

The data storage device 120 can store data received from the host system 110 such that the data storage device 120 acts as data storage for the host system 110. To facilitate this function, the controller 130 can implement a logical interface. The logical interface can present to the host system memory as a set of logical addresses (e.g., sequential/contiguous addresses) where data can be stored. Internally, the controller 130 can map logical addresses to various physical memory addresses in the non-volatile solid-state memory array 150 and/or other memory module(s). Mapping data indicating the mapping of logical addresses to physical memory addresses may be maintained in the data storage device. For example, mapping table data may be stored in non-volatile memory array(s) 150 in order to allow for recreation of mapping tables following a power cycle.

In certain embodiments, on power-up, the controller may cache mapping table data stored in the non-volatile solid-state memory array(s) 150 to volatile memory 132. In response to receipt and execution of host-issued memory commands, the controller 130 may update the cached mapping table data and periodically or sporadically flush such data to the memory array(s) 150. For example, as data stored in volatile memory can be lost when power to the memory is removed, it may be necessary or desirable to flush any cached mapping data to non-volatile memory before power to the controller 130 is lost.

In an embodiment, the data storage device 120 may be a hybrid disk drive that additionally includes magnetic memory storage (not shown). In such case, one or more controllers 130 may control the magnetic memory storage and the non-volatile solid-state memory array(s) 150.

Figure 2A:
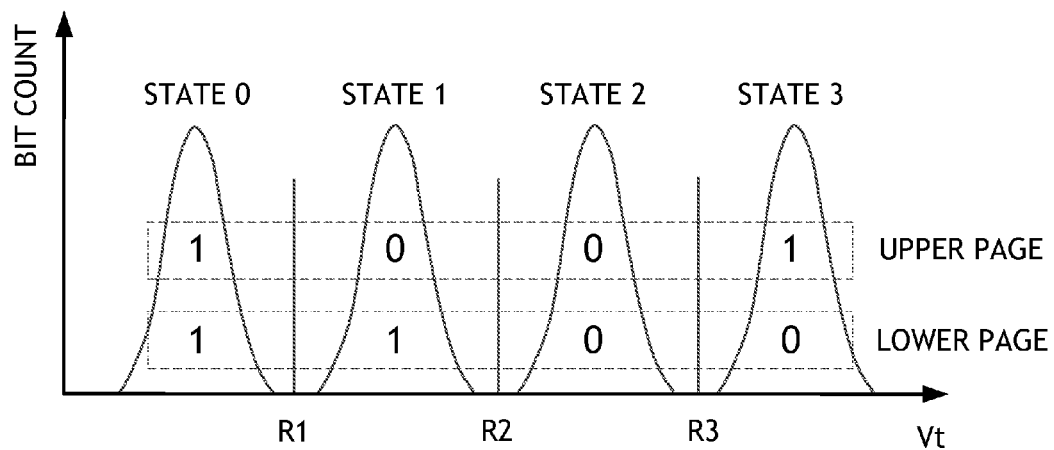
FIG. 2A is a graph showing a probability distribution of cells in a non-volatile memory array according to an embodiment.

FIG. 2A is a graph showing a probability distribution of cells in a non-volatile memory array according to an embodiment. The distribution of FIG. 2A is associated with an MLC programming scheme, in which two bits of information are stored in a single memory cell. However, it should be understood that systems and methods disclosed herein may be utilized with respect to single-level cell (SLC) technology, or other technologies.

FIG. 2A shows four programming states (States 0-3), wherein each state represents two bits of data. In certain embodiments, the programming states each comprise a most-significant bit, referred to herein as the "upper page," and a least-significant bit, referred to herein as the "lower page." Furthermore, in certain embodiments, "upper page" may refer to the least-significant bit, while "lower page" refers to the most-significant bit.

Figure 2B:
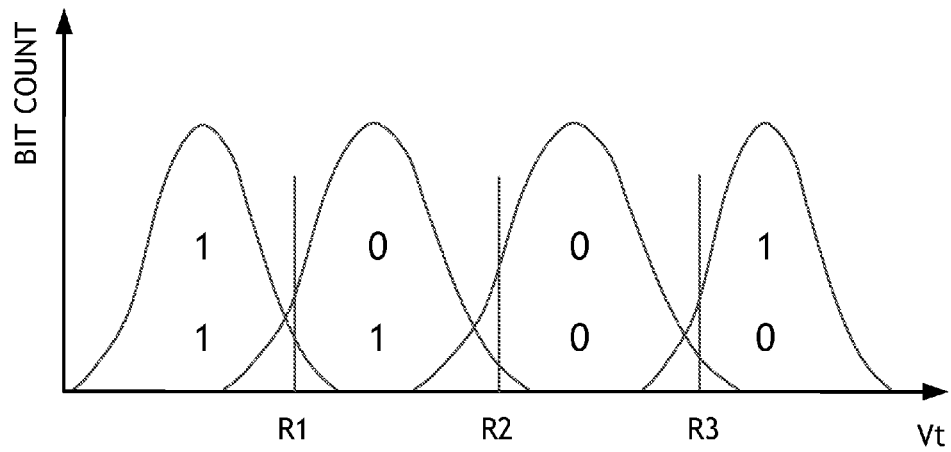
FIG. 2B is a graph showing a probability distribution of cells including overlapping states according to an embodiment.

Over time, memory degradation, loss of data retention, and the like, can cause the states of a voltage distribution can widen and overlap. FIG. 2B shows the voltage distribution of FIG. 2A, wherein the programming states have overlapped, which can have a negative effect on data retention. For example, as one state overlaps another, the charge of a memory cell may cross the relevant read threshold, causing a bit to "flip" from '0' to '1' or vice versa.

Data Retention Flag Bytes

Certain embodiments disclosed herein provide for the assignment of one or more bytes in a target page as one or more copies of a data retention flag. The flag may include a count of the number of '0' or '1' bits in the raw data to be written to the target page. In certain embodiments, the data retention flag is stored in a separate memory array or device than the raw data. As described herein, a variable 'Np' may be used to represent the count of the number of '0' or '1' bits, which may be stored in usable area of the target page, which is described below with respect to FIG. 3.

Figure 3:
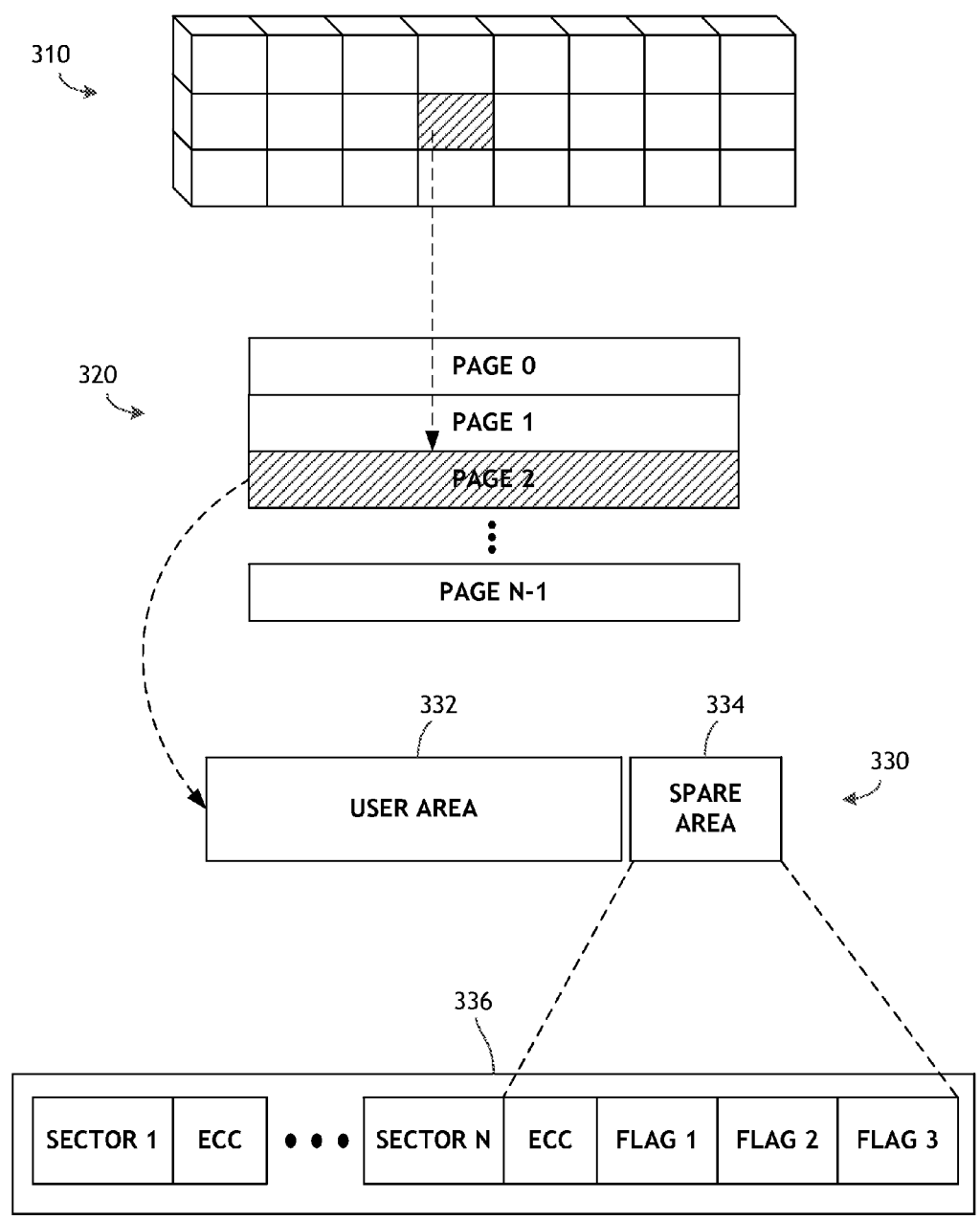
FIG. 3 illustrates an example block and page scheme in a solid-state array according to one or more embodiments.

FIG. 3 illustrates an example block and page scheme in a solid-state array according to one or more embodiments. In certain embodiments, page units 320 are used to store data, where a group of pages is referred to as a block. A solid-state array may comprise a plurality of blocks 310, each block comprising a plurality of pages 320. In certain embodiments, the page size may be fixed from, for example, 512 B to 8 KB, while the block size may be, for example, between 4 KB and 128 KB. The page unit may be partitioned into two or more areas. Specifically, a page 330 may include an area designated for raw data ("user area"), as well as a separate area reserved for ECC and/or other software information ("spare area"). In certain embodiments, the spare area includes approximately 64 bytes. For example, the spare area may be used to store, among possibly other things, metadata associated with the raw data (such as bad block identification, page and block data structures, error correction code (ECC), data retention flags, etc.). The data structure 336 illustrated in FIG. 3 comprises a page of solid-state memory where both ECC and data retention flag bytes (e.g., for storing Np value(s)) are present.

In certain embodiments, the '0' or '1' count (Np) is stored in the spare area 334 of the page 330. Alternatively, Np may be stored in bytes allocated from the user area of the page. In certain embodiments, Np is stored in a separate page, array, or device than the raw data with which it is associated. The data structure 336 includes interleaved user area and spare area. As shown, the spare area 334 may include one or more ECC sectors, as well as one or more additional flag bytes, or sectors. Np may be stored in one or more of the flag bytes. When the raw data is read, the number of '1' or '0' bits may be extracted from the read operation (represented herein by the variable Nr).

Figure 4B:
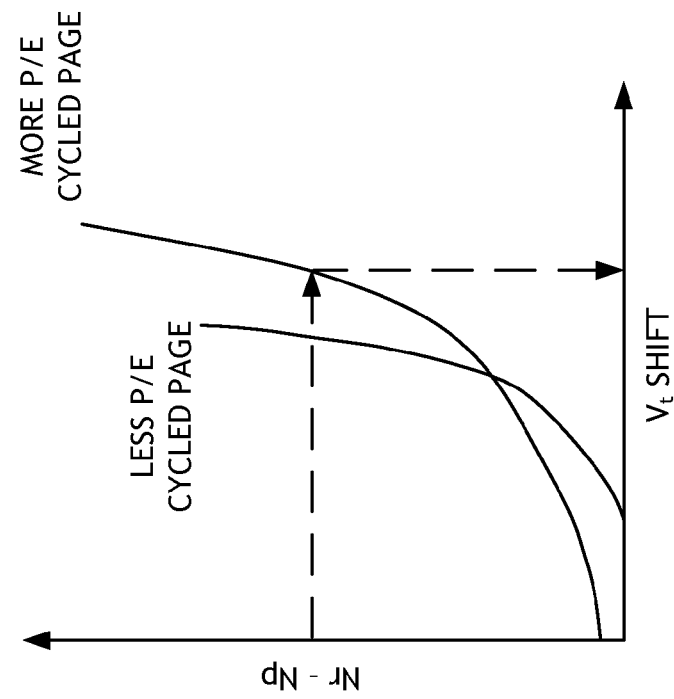
FIGS. 4A and 4B are graphs representing example data retention characteristics in a non-volatile memory array according to some embodiments.
Figure 4A:
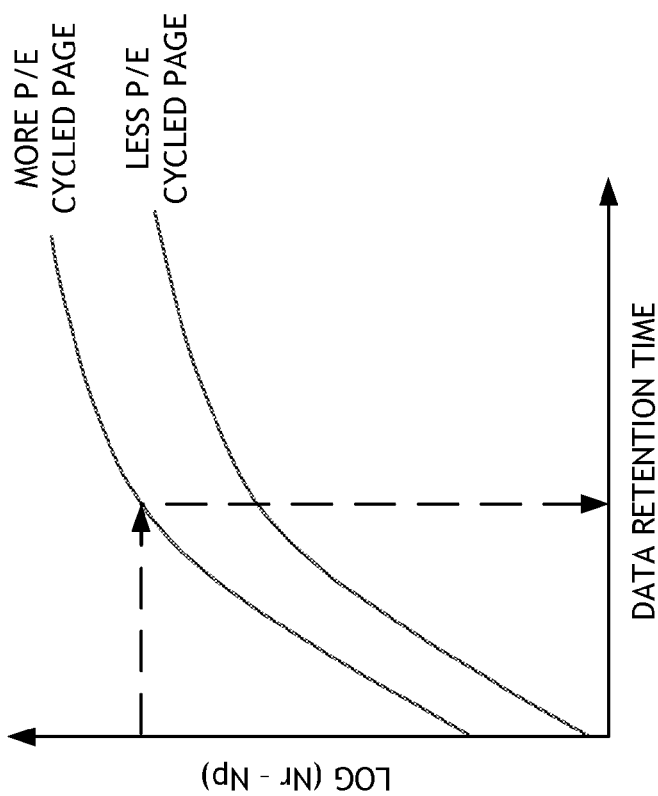

In certain embodiments, Nr may be compared to Np, wherein the difference between Np and Nr is used to estimate the data retention effect between the current read operation and the previous program operation associated with the data. The data retention effect indicated by the difference between Np and Nr may represent a combined effect of both time and temperature. FIG. 4A shows how effective data retention time ("equivalent time") may be related to the difference between Nr and Np, wherein the y-axis of the graph represents the log of the difference and the x-axis represents effective data retention time. The relationship demonstrated in FIG. 4A may be used to estimate effective data retention time based on Nr and Np. Since data retention can be closely related to the block's cycling condition, the P/E cycling information may be required, or desirable, to determine an accurate estimation of data retention.

Based on the difference between Np and Nr, the data storage device may also be configured to estimate how much the relevant voltage reading level ($V_t$) for the page, or one or more cells thereof, should be adjusted to reduce bit errors. FIG. 4B shows a graph that illustrates the relationship between $V_t$ shift and the difference between Nr and Np in an embodiment. Such relationship may be used to determine Vt shift information from the value of (Nr–Np). In certain embodiments, the desirable read level adjustment for a particular page is directly related to $V_t$ shift that the page exhibits.

In certain embodiments, prior to implementation of methods described herein, it may be desirable for a solid-state drive, or portions thereof, to be calibrated to determine the correlation among data retention, Nr–Np, and/or $V_t$ shift. Such calibration may be performed in any suitable manner, as understood by those having ordinary skill in the art. The characterization and calibration may involve taking data retention measurements of the drive with varying P/E cycling, retention time, temperature, and/or data retention-relevant characteristics. For example, the drive may be baked to accelerate data retention, wherein bit error counts are periodically taken to determine drive data retention behavior.

Systems and methods for determining data retention and/or read level adjustment in solid-state drives, as disclosed herein, may or may not involve ECC. In order to improve the integrity for the data retention flag, more than one set of Np may be programmed. Upon read, the data storage device may access a plurality of stored instances for determining the valid value of Np. In order to improve the reliability of the Np metadata, in certain embodiments, such metadata cells are programmed to lower Vt state(s), such as State 1 (first program state) or State 2 (second program state) as shown in FIG. 2A, or commonly referred to as programming in "lower page only mode."

If the flash page has approximately 8K bytes, a Np number stored in the spare area of the page may utilize approximately 2 bytes, for example. Therefore, in certain embodiments, three sets of Np may utilize approximately 6 bytes of storage space. In a data storage device including a randomizer, the number of '0's and '1's may be substantially close to each other. If, for example, there exists a 5% unbalance between the number of '0's and '1's, then the unbalance between the count of '0' and '1' may be in the vicinity of 1638 for an 8 KB page. Therefore, if the 4 KB point of the page is used as the middle point reference, the value for Np may be limited by a maximum of around 820, which can be programmed using 10 bits. Further, storing three copies of Np may therefore require approximately 30 bits; 4 bytes may provide enough storage space for such bits.

In certain embodiments, reliability of data retention flag bytes can be improved by programming such bytes interleaved with dummy bits between, for example, any two data retention flag bits; the dummy bites may not be programmed. Use of dummy bits may reduce cell-to-cell interference, thereby improving the read margins for the flag bytes.

With reference to FIGS. 2A and 2B, as described above, logic data coding may include 2-bits-per-cell in MLC memory, wherein the 2 bits are conceptually separated into upper and lower pages. The diagrams also illustrate the correlation between the upper page and lower page to Vt state, according to an embodiment. In certain embodiments, determining the lower page value involves performing a read operation at R2. Determining the upper page, on the other hand, may involve reads at R1 and R3.

In certain embodiments, determining upper page data may be relatively complex. As shown in FIG. 2A, both State 0 and State 3 include a '1' for the upper page value, and both State 1 and State 2 include a '0' for the upper page value. An increase of '1' can occur not only from a transition between States 3 and 2, but also from transition between States 0 and 1. Furthermore, a transition from State 0 to State 1 can be caused by read disturb and program disturb as well.

Figure 5:
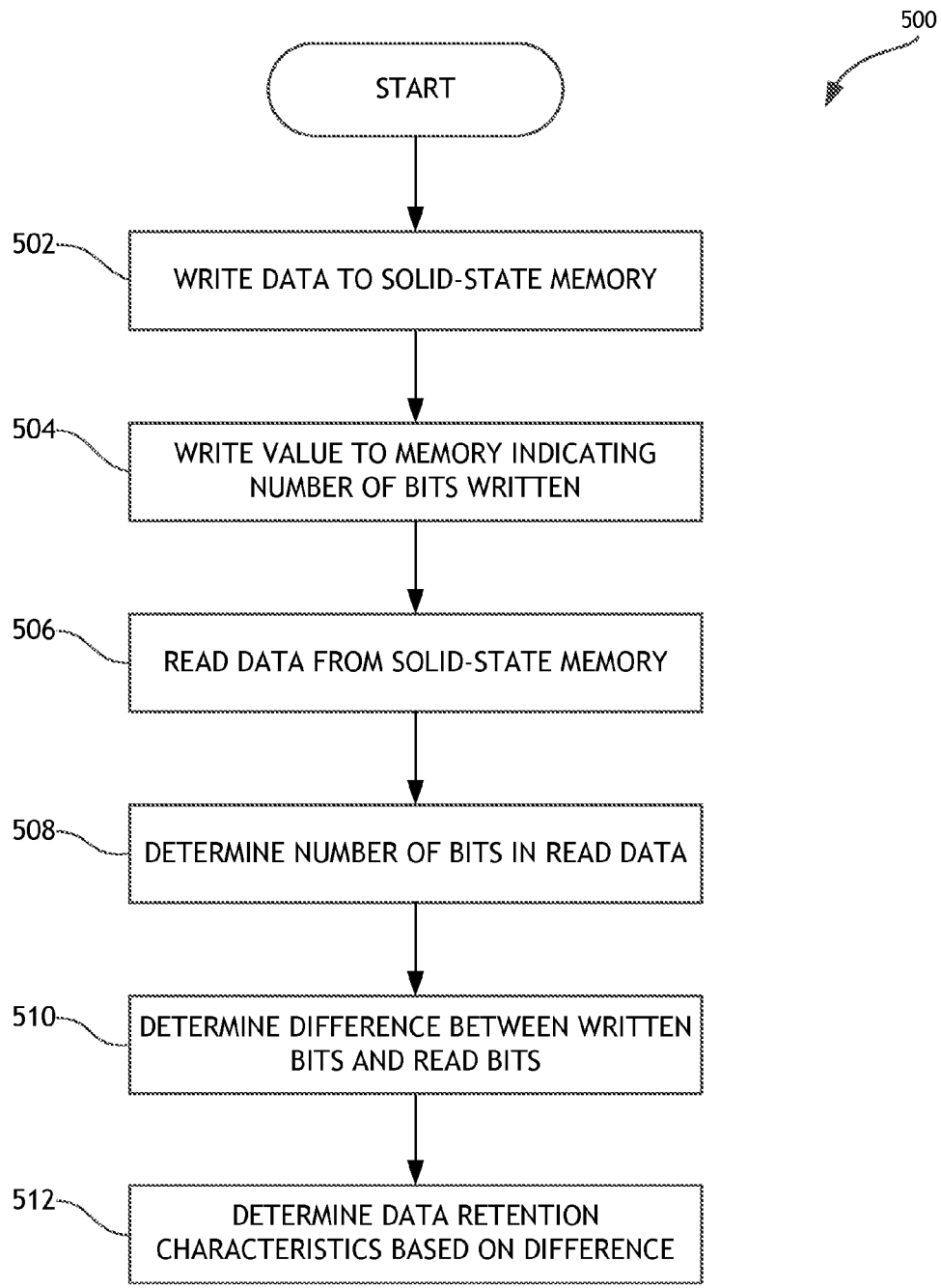
FIG. 5 is a flow diagram illustrating a process for managing data retention according to an embodiment.

FIG. 5 is a flow diagram is illustrating an example process 500 for a lower page read with data retention bytes implemented, as described herein. Some or all of the actions shown in the flow diagram of FIG. 5 may be performed by the controller 130 shown in FIG. 1. The process 500 includes writing data, such as user data from a host system, to solid-state memory at block 502. In addition to the data, one or more copies of a value are written to memory indicating the number of data bits written to a certain logical state, such as, for example, '0' or '1.' The value may be written to the solid-state memory in which the user data is stored, or may be written to a separate memory. In certain embodiments, the writing the data and the value, as shown at blocks 502 and 504, may be performed as part of a singular step.

When the user data is subsequently read from the solid-state memory at block 506, the number of bits of the read user data that are of the certain logical state is determined at block 508. The difference between the number of bits written to the certain logical state and the number of bits read of the certain logical state is determined at block 510. The difference is used to determine data retention characteristics of the solid-state memory.

Figure 6:
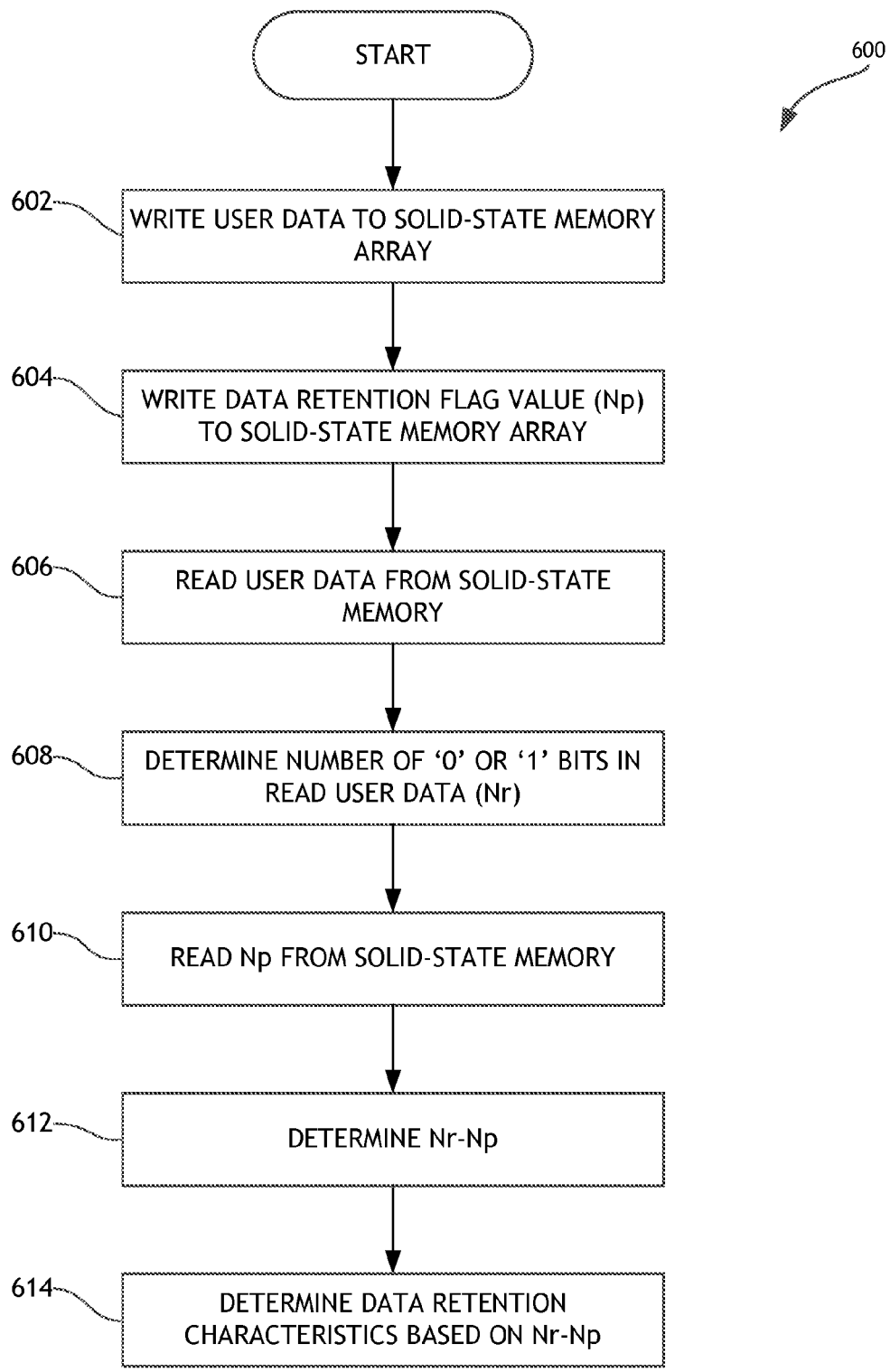
FIG. 6 is a flow diagram illustrating a process for managing data retention according to an embodiment.

FIG. 6 is a flow diagram illustrating another process 600 for managing data retention according to an embodiment. Some or all of the actions shown in the flow diagram of FIG. 6 may be performed by the controller 130 shown in FIG. 1. The process 600 includes writing data user data to a solid-state memory array at block 602. In addition to the user data, one or more copies of a data retention flag value (Np) are written to the solid-state memory array that indicate the number of data '0' or '1' bits of the user data that were written.

When the user data is subsequently read from the solid-state memory at block 606, the number of '0' or '1' bits (Nr) in the read user data is determined at block 608. Furthermore, the number Np stored in the memory is also read at block 610. The difference between Nr and Np (Nr–Np) is determined at block 612. The difference is used to determine data retention characteristics of the solid-state memory.

Figure 7:
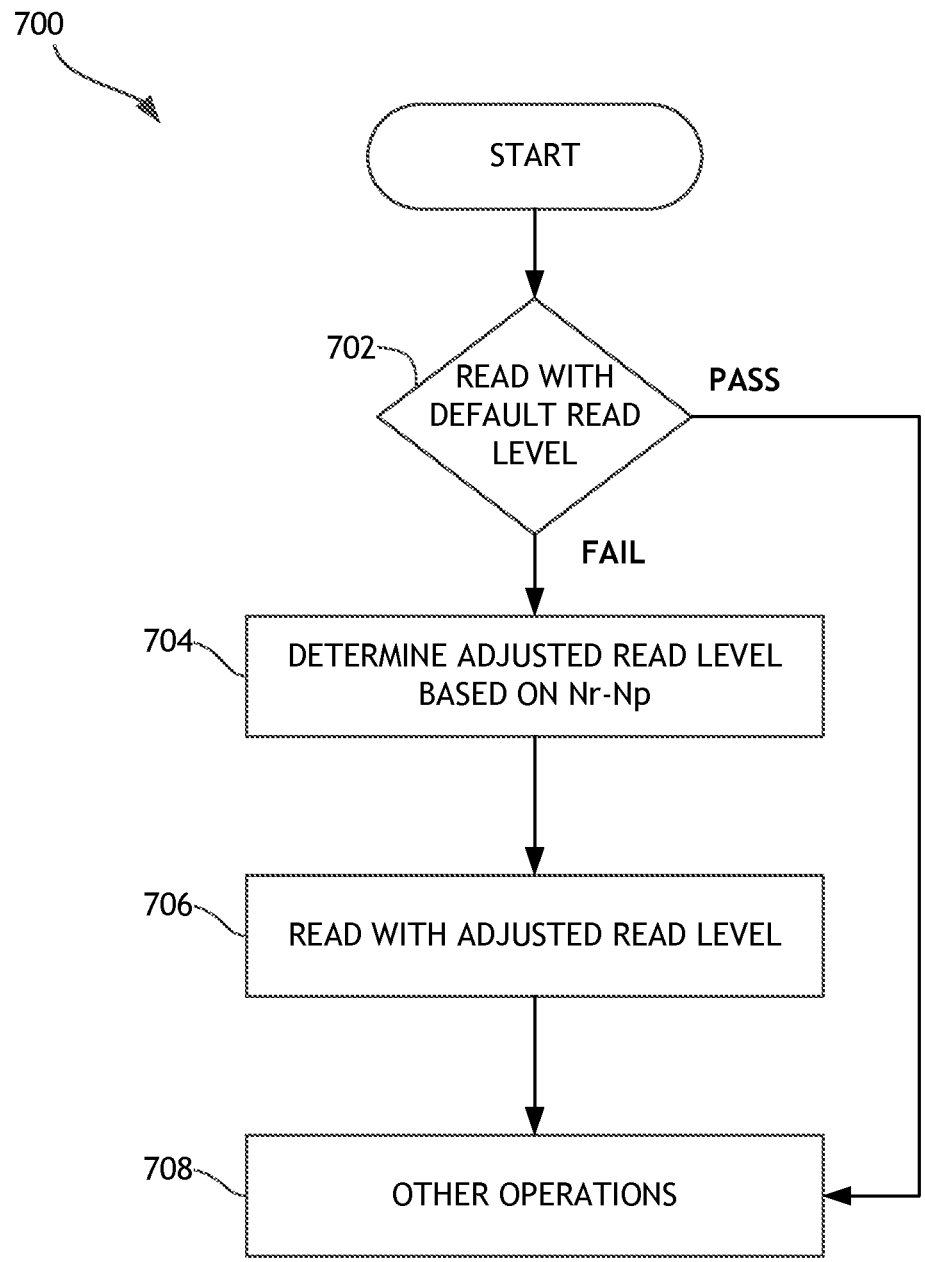
FIG. 7 is a flow diagram illustrating a process for determining voltage read level adjustment according to an embodiment.

FIG. 7 is a flow diagram illustrating a process 700 for determining voltage read level adjustment according to an embodiment. Some or all of the actions shown in the flow diagram of FIG. 7 may be performed by the controller 130 shown in FIG. 1. The process 700 includes reading solid-state memory at a default read level, shown at decision block 702. If the read is successful, the process 700 progresses to block 708 where the data storage device may engage in other operations. However, if the read operation fails, the process 700 proceeds to block 704, where the difference between Nr and Np, as described in detail above, is used to determine an adjusted read level. At block 706, the memory is read using the adjusted read level.

Figure 8:
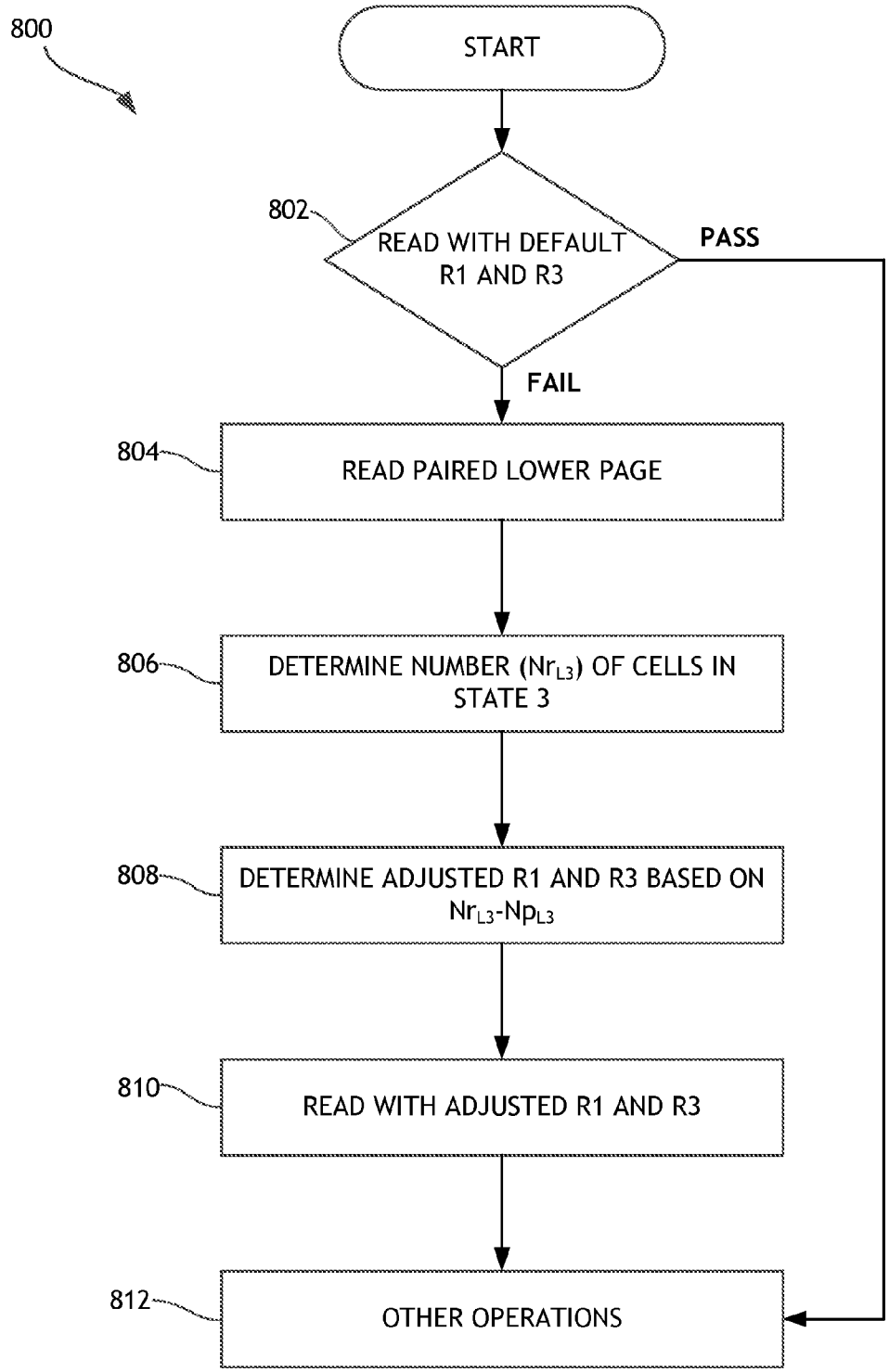
FIG. 8 is a flow diagram illustrating a process for performing upper page reads according to an embodiment.

FIG. 8 is a flow diagram illustrating a process 800 for performing upper page reads with data retention flag bytes according to an embodiment. Some or all of the actions shown in the flow diagram of FIG. 8 may be performed by the controller 130 shown in FIG. 1. The process 800 may involve reading upper page data using default voltage read levels. For example, reading upper page data may involve doing two reads, one at R1, and one at R3, as illustrated above in FIG. 2A. If the read is successful, the process 800 may proceed to block 812 where the data storage device may engage in other operations. However, if the read operation fails, the process 800 proceeds to block 804, where the respective paired lower page is read, which may provide information useful for determining the number of cells programmed to a highest voltage state, State 3 (see, e.g., FIG. 2A). The number of cells programmed to the solid-state memory in State 3 is referred to herein as $Np_{L3}$, which value may be stored as a flag value in the solid-state memory. Furthermore, the number of cells of user data read from solid-state memory that are associated with State 3 is referred to herein as $Nr_{L3}$.

At block 808, the difference between $Np_{L3}$ and $Nr_{L3}$ is determined, which may be used to determine adjusted voltage read levels for R1 and R3. In certain embodiments, the difference may be used for other purposes, such as to determine a data refreshing schedule, or for other data retention-related purposes. The data may then be read using the adjusted voltage read level values.

Figure 9:
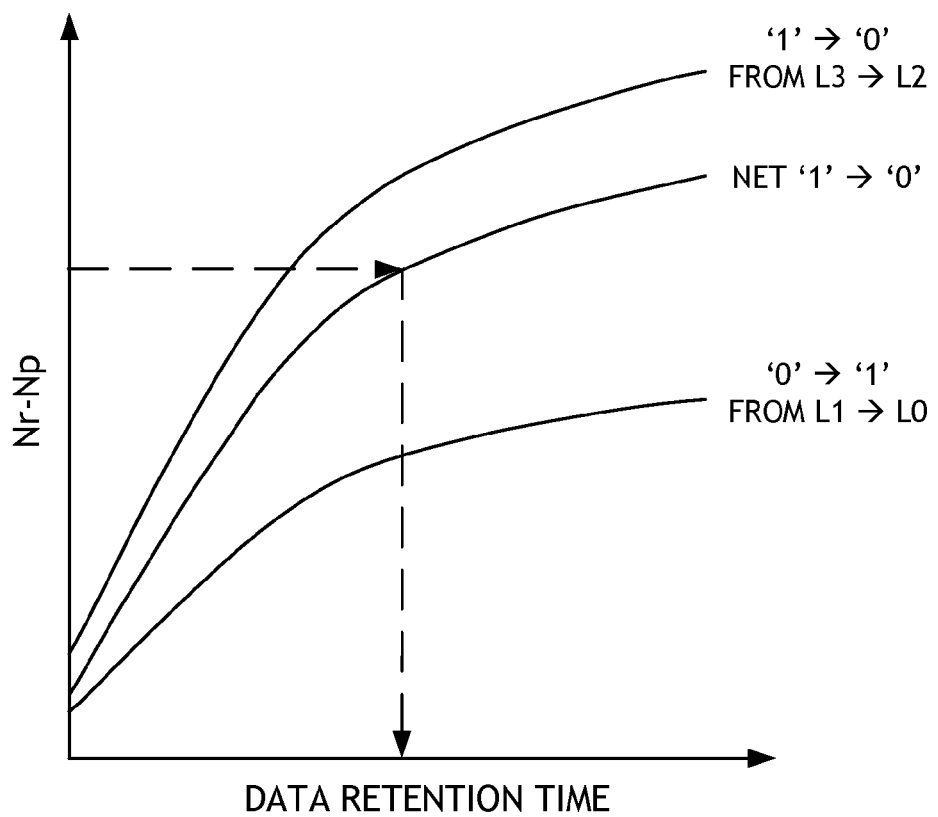
FIG. 9 is a graph showing data retention characteristics in a non-volatile memory array according to an embodiment.

FIG. 9 is a graph showing data retention characteristics in a non-volatile memory array according to an embodiment. The graph demonstrates how effective data retention time may be correlated with the difference between Np and Nr counts for R1, R3, and combined R1 and R3 reads. As shown, the number of transitions from '1' to '0' from bit flips between States 3 and 2 is generally greater than the number of transitions from '0' to '1' from bit flips between States 1 and 0. Generally, data retention can be more severer for higher Vt states (such as State 3) than for lower Vt states (such as State 1). So after data retention, the net effect in upper page bit fail may correspond to the increase of '1' to '0' transitions. As shown in FIG. 9, the number of '1's that transition to '0' may be greater than the number of '0's that transition to '1's, resulting in a net increase in the number of '0's. Therefore, the relationship between the net transition from '1' to '0' and effective data retention time may be represented. In an embodiment, upper page read is performed by simply counting the net number change Nr–Np and calibrating it with the memory's data retention data. Such an embodiment may provide relatively less accurate results, while being relatively simpler than embodiments disclosed above.

Certain factors, such as imperfect programming and cell-to-cell interference, even without data retention, may cause the actual number of '0' (or '1') bits Nr0 may differ from Np immediately after programming. Such difference is reflected in the calibration curves (FIGS. 4A and 9) with an offset that may be a function of P/E cycling condition. Therefore, the increment from Np to Nr0 can be used as a quality monitor for that block.

Conclusion

Certain systems and methods disclosed herein provide for automatically accounting of the combined effects on data retention of both time and temperature. Data retention can affect the failing bit number (transition from higher $V_t$ to lower $V_t$) and may be reflected in the value of Nr–Np, as described above. In certain embodiments, ECC is not required for equivalent data retention time and/or optimal $V_t$ shift estimation. Therefore, certain embodiments may provide a mechanism for read-level tracking in very poor data retention cases where ECC may fail with the default read level. By reading the raw data and comparing it against the reference flag(s), data retention, and therefore read level adjustment amount, may be determined. Such systems and methods may be effective whether the solid-state drive has been powered off or not.

The implementation these metadata bytes, as described herein, may indicate a threshold for data scrubbing alert. Because data retention flag bytes can be written at the page level, certain embodiments may provide an adaptive method for individual pages. If read substantially immediately after programming, comparison of Np and Nr can provide useful information for the page/block. In certain embodiments, data retention flag bytes may use two or few bytes, which may be assigned from the raw data in each flash page. Therefore, data retention flag bytes may not result in a significant waste of storage capacity.

With respect to upper page reads, lower page data may be required to determine cells in State 3. Then based on fail bit increases for cells in State 3, data retention effect may be correctly calculated. The process may include reading the upper page and it's paired lower page to determine the fail bit number for State 3 (or State 1) only. This however, may require the target number of State 3 cells in programming ($Np_{L3}$), which can be stored in the spare area of the page. Once the difference between Nr and Np is determined for either State 0 or State 1, the process may be similar to that shown in FIG. 5 for lower page read with data retention flag bytes.

Other Variations

Those skilled in the art will appreciate that in some embodiments, other types of data storage systems and/or power management can be implemented. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data storage device comprising:
a non-volatile memory array comprising a plurality of non-volatile memory devices; and
a controller configured to:
write data to a memory unit of the non-volatile memory array;
write a value to a memory indicating a number of bits of the written data programmed in a first of a plurality of logical states;
read the written data from the non-volatile memory array;
determine a number of bits having the first of the plurality of logical states in the read data;
determine a difference between the number of bits of the written data programmed in the first logical state and the number of bits having the first logical state in the read data; and
schedule a data refreshing operation for the non-volatile memory array based at least in part on the difference.

2. The data storage device of claim 1, wherein the first of the plurality of logical states corresponds to a value of '0' and a second of the plurality of logical states corresponds to a value of '1'.

3. The data storage device of claim 1, wherein the first of the plurality of logical states corresponds to a value of '1' and a second of the plurality of logical states corresponds to a value of '0'.

4. The data storage device of claim 1, wherein the controller is further configured to:
determine an effective data retention time associated with the non-volatile memory array based at least in part on the difference.

5. The data storage device of claim 4, wherein the controller is further configured to determine the effective data retention time based at least in part on a program/erase cycling condition of a portion of the non-volatile memory array.

6. The data storage device of claim 1, wherein the controller is further configured to:
determine a shifted voltage read level associated with at least a portion of the non-volatile memory array based at least in part on the difference.

7. The data storage device of claim 1, wherein the controller is further configured to:
write three or more copies of the value to the non-volatile memory array;
read the three or more copies of the value from the non-volatile memory array; and
determine the number of bits of the written data programmed in the first logical state by identifying two or more matching read values of the three or more copies.

8. The data storage device of claim 1, wherein the controller is further configured to write the data to the non-volatile memory array using a multi-level cell (MLC) programming scheme including four programming states, wherein the data is programmed to cells of the non-volatile memory array comprising an upper bit and a lower bit of information.

9. The data storage device of claim 1, wherein the controller is further configured to write the value interleaved with dummy bits to reduce cell-to-cell interference.

10. A data storage device comprising:
a non-volatile memory array comprising a plurality of non-volatile memory devices; and
a controller configured to:
write data to a memory unit of the non-volatile memory array;
write a value to a memory indicating a number of bits of the written data programmed in a first of a plurality of logical states;
read the data from the non-volatile memory array;
determine a number of bits having the first of the logical states in the read data;
determine a difference between the number of bits of the written data programmed in the first logical state and the number of bits having the first logical state in the read data;
determine a raw bit error rate (RBER) associated with at least a portion of the non-volatile memory array based at least in part on the difference; and
schedule a data refreshing operation for the at least a portion of the non-volatile memory array based at least in part on the RBER.

11. A data storage device comprising:
a non-volatile memory array comprising a plurality of non-volatile memory devices; and
a controller configured to:
write data to a memory unit of the non-volatile memory array using a multi-level cell (MLC) programming scheme including four programming states;
write a value to a memory indicating a number of cells programmed to a highest voltage state of the four programming states;
read the data from the non-volatile memory array;
determine a number of read cells of the highest voltage state;
read the value from the non-volatile memory array;
determine a difference between the number of programmed cells of the highest voltage state and the number of read cells of the highest voltage state;
determine one or more adjusted read levels associated with the non-volatile memory array based at least in part on the difference; and
schedule a data refreshing operation for at least a portion of the non-volatile memory array based at least in part on the difference.

12. The data storage device of claim 11, wherein the controller is further configured to determine the number of read cells of the highest voltage state at least in part by performing both upper page and lower page reads.

13. The data storage device of claim 11, wherein the controller is further configured to write the value using cells programmed to lowest or second-lowest programming states of the four programming states.

14. A method of managing data retention in a data storage system comprising a non-volatile memory array, the method comprising:
- writing data to a memory unit of a non-volatile memory array;
- writing a value to a memory indicating a number of bits of the written data programmed in a first of a plurality of logical states; and
- writing multiple copies of the value to the non-volatile memory array;
- reading the data from the non-volatile memory array;
- determining a number of bits having the first of the logical states in the read data;
- determining a difference between the number of bits of the written data programmed in the first logical state and the number of bits having the first logical state in the read data; and
- scheduling a data refreshing operation for at least a portion of the non-volatile memory array based at least in part on the difference,
- wherein the method is performed under the control of a controller of the data storage system.

15. The method of claim 14, wherein the first of the plurality of logical states corresponds to a value of '0' and a second of the plurality of logical states corresponds to a value of '1'.

16. The method of claim 14, wherein the first of the plurality of logical states corresponds to a value of '1' and a second of the plurality of logical states corresponds to a value of '0'.

17. The method of claim 14, further comprising:
- determining an effective data retention time associated with the non-volatile memory array based at least in part on the difference.

18. The method of claim 17, wherein determining the effective data retention time is based at least in part on a program/erase cycling condition of a portion of the non-volatile memory array.

19. The method of claim 14, further comprising:
- determining a shifted voltage read level associated with at least a portion of the non-volatile memory array based at least in part on the difference.

20. The method of claim 14, wherein writing the multiple copies of the value to the non-volatile memory array comprises writing three or more copies of the value to the non-volatile memory array, and wherein the method further comprises:
- reading the three or more copies of the value from the non-volatile memory array; and
- determining the number of bits of the written data programmed in the first logical state by identifying two or more matching read values of the three or more copies.

21. The method of claim 14, wherein writing the data to the non-volatile memory array is performed according to a multi-level cell (MLC) programming scheme including four programming states, and wherein the data is programmed to cells of the non-volatile memory array comprising an upper bit and a lower bit of information.

22. The method of claim 14, further comprising writing dummy bits interleaved with the value to reduce cell-to-cell interference.

23. A method of managing data retention in a data storage system comprising a non-volatile memory array, the method comprising:
- writing data to a memory unit of a non-volatile memory array;
- writing a value to a memory indicating a number of bits of the written data programmed in a first of a plurality of logical states;
- reading the data from the non-volatile memory array;
- determining, from the data read from the non-volatile memory array, a number of read bits in the first of the plurality of logical states;
- reading the value indicating the number of programmed bits from the memory;
- determining a difference between the number of programmed bits and the number of read bits;
- determining a raw bit error rate (RBER) associated with at least a portion of the non-volatile memory array based at least in part on the difference between the number of programmed bits and the number of read bits; and
- scheduling a data refreshing operation for the at least a portion of the non-volatile memory array based at least in part on the RBER,
- wherein the method is performed under the control of a controller of the data storage system.

24. A method of managing data retention in a data storage system comprising a non-volatile memory array, the method comprising:
- writing data to a memory unit of a non-volatile memory array according to a multi-level cell (MLC) programming scheme including four programming states;
- writing a value to a memory indicating a number of cells programmed to a highest voltage state of the four programming states;
- reading the data from the non-volatile memory array;
- determining a number of read cells of the highest voltage state;
- reading the value from the non-volatile memory array;
- determining a difference between the number of programmed cells of the highest voltage state and the number of read cells of the highest voltage state; and
- determining one or more adjusted read levels associated with the non-volatile memory array based at least in part on the difference, and
- scheduling a data refreshing operation for the at least a portion of the non-volatile memory array based at least in part on the difference.

25. The method of claim 24, further comprising determining the number of read cells of the highest voltage state at least in part by performing both upper page and lower page reads.

26. The method of claim 24, further comprising writing the value using cells programmed to lowest or second-lowest programming states of the four programming states.

27. A data storage device comprising:
- a non-volatile memory array comprising a plurality of non-volatile memory devices; and
- a controller configured to:
    - write data to a memory unit of the non-volatile memory array;
    - write multiple copies of a value to the non-volatile memory array, the value indicating a number of upper page bits of the written data programmed in a first of a plurality of logical states;
    - read the data from the memory array;

determine, based on the read data, a number of the upper page bits that have flipped;

determine a net difference between the number of upper page bits of the written data programmed in the first logical state and a number of upper page bits in the first logical state in the read data; and schedule a data refreshing operation for the at least a portion of the non-volatile memory array based at least in part on the net difference.

28. The data storage device of claim 27, wherein the first of the plurality of logical states corresponds to a value of '0' and a second of the plurality of logical states corresponds to a value of '1'.

29. The data storage device of claim 27, wherein the first of the plurality of logical states corresponds to a value of '1' and a second of the plurality of logical states corresponds to a value of '0'.

* * * * *